(12) United States Patent
Nishida et al.

(10) Patent No.: US 11,361,979 B2
(45) Date of Patent: Jun. 14, 2022

(54) SUBSTRATE PROCESSING APPARATUS AND SUBSTRATE PROCESSING METHOD

(71) Applicant: SCREEN Holdings Co., Ltd., Kyoto (JP)

(72) Inventors: Takayuki Nishida, Kyoto (JP); Nobuaki Okita, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/231,611

(22) Filed: Dec. 24, 2018

(65) Prior Publication Data

US 2019/0244835 A1 Aug. 8, 2019

(30) Foreign Application Priority Data

Feb. 8, 2018 (JP) .............................. JP2018-021265

(51) Int. Cl.
*H01L 21/67* (2006.01)
*H01L 21/677* (2006.01)
*H01L 21/68* (2006.01)
*H01L 21/687* (2006.01)

(52) U.S. Cl.
CPC .. *H01L 21/67034* (2013.01); *H01L 21/67028* (2013.01); *H01L 21/67051* (2013.01); *H01L 21/67739* (2013.01); *H01L 21/68* (2013.01); *H01L 21/68721* (2013.01); *H01L 21/68728* (2013.01); *H01L 21/68735* (2013.01)

(58) Field of Classification Search
CPC ......... H01L 21/68728; H01L 21/28735; H01L 21/68721; H01L 21/68764; H01L 21/68785
See application file for complete search history.

(56) References Cited

U.S. PATENT DOCUMENTS

| 2015/0270146 A1* | 9/2015 | Yoshihara ......... H01L 21/68742 134/18 |
|---|---|---|
| 2016/0096205 A1 | 4/2016 | Kato |
| 2017/0098538 A1 | 4/2017 | Nakai |
| 2017/0098553 A1 | 4/2017 | Nakai et al. |
| 2017/0148660 A1 | 5/2017 | Toyomura et al. |
| 2017/0278727 A1 | 9/2017 | Mouri et al. |
| 2017/0338131 A1 | 11/2017 | Amahisa et al. |

FOREIGN PATENT DOCUMENTS

| JP | 2004048035 | 2/2004 |
|---|---|---|
| JP | 2010093189 | 4/2010 |
| JP | 2014022419 | 2/2014 |

(Continued)

*Primary Examiner* — Natasha N Campbell
(74) *Attorney, Agent, or Firm* — JCIPRNET

(57) ABSTRACT

A substrate processing apparatus includes a substrate holding portion which holds a substrate W. The substrate holding portion includes two movable holding pins and two fixed holding pins which sandwich the substrate. The substrate processing apparatus includes two support pins which support the substrate W held by the substrate holding portion from below. Each of the support pins has an inner portion which overlaps the substrate held by the substrate holding portion in a vertical direction. An upper end of the support pin is on a side below an overlapping portion of the substrate which overlaps the inner portion in the vertical direction.

10 Claims, 7 Drawing Sheets

(56) References Cited

FOREIGN PATENT DOCUMENTS

| | | |
|---|---|---|
| JP | 2014-045028 | 3/2014 |
| JP | 2015002328 | 1/2015 |
| JP | 2016-189452 | 11/2016 |
| JP | 2017098330 | 6/2017 |
| JP | 2017183310 | 10/2017 |
| WO | 2015137188 | 9/2015 |

* cited by examiner

SUBSTRATE PROCESSING APPARATUS AND
SUBSTRATE PROCESSING METHOD

CROSS-REFERENCE TO RELATED
APPLICATION

This application claims the priority of Japan patent application serial no. 2018-021265, filed on Feb. 8, 2018. The entirety of the above-mentioned patent application is hereby incorporated by reference herein and made a part of this specification.

BACKGROUND

Technical Field

The subject matter of this disclosure relates to a technology for processing a substrate, and particularly, to a technology for holding a substrate. Examples of the substrate to be processed include, for example, semiconductor substrates, substrates for a liquid crystal display device, substrates for a flat panel display (FPD) such as an organic electroluminescence (organic EL) display device, substrates for an optical disc, substrates for a magnetic disk, substrates for a magneto-optical disc, substrates for a photomask, ceramic substrates, substrates for a solar cell, and the like.

Description of Related Art

Substrate processing apparatuses for processing a substrate such as a semiconductor wafer can be divided into batch type processing apparatuses for collectively processing a plurality of substrates, and single wafer type processing apparatuses for processing substrates to be processed one at a time in a processing chamber. In a typical single wafer type processing apparatus, one substrate is horizontally held in a processing chamber, and then the substrate is rotated, and a processing liquid (a chemical liquid or a rinsing liquid) is supplied to the substrate according to the details of the processing.

A single wafer type processing apparatus may have, for example, a plurality of holding members (for example, chuck pins) in a rotation direction on a spin base rotating around a rotation axis. In the single wafer type processing apparatus, a plurality of holding members sandwich a peripheral end portion of the substrate so that the substrate is held horizontally (see Japanese Laid-Open No. 2016-189452, for example).

However, with a shape of conventional holding members, there is a likelihood that a processing liquid supplied to a rotating substrate will impinge on the holding members and pass around to a lower surface side of the substrate. Particularly, when the processing liquid contains particles, there is a likelihood that the lower surface of the substrate will be contaminated with particles due to the processing liquid passing around. When the lower surface of the substrate is a device surface, contamination of the device surface may decrease a yield of the semiconductor device.

SUMMARY

The disclosure provides a technology for reducing an amount of processing liquid supplied to an upper surface of a rotating substrate passing around to a lower surface side of the substrate.

Preferably, one aspect of the disclosure is a substrate processing apparatus for processing a substrate including a spin base, a rotation drive unit rotating the spin base around a rotation axis in a vertical direction, a substrate holding portion provided on the spin base and configured to hold the substrate, a substrate support portion provided on the spin base, disposed below the substrate held by the substrate holding portion, and having an inner portion overlapping the substrate in the vertical direction, and a processing liquid supply portion supplying a processing liquid on an upper surface of the substrate held by the substrate holding portion, in which an upper end of the substrate support portion is on a side below an upper surface of an overlapping portion of the substrate held by the substrate holding portion that overlaps the inner portion in the vertical direction.

One aspect of the disclosure is a substrate processing method for processing a substrate including (a) a step in which a substrate holding portion provided on a spin base holds a substrate, (b) a step in which a substrate support portion provided on the spin base supports the substrate held by the substrate holding portion in step (a), (c) a step in which the substrate is rotated by rotating the spin base around a rotation axis in a vertical direction, and (d) a step in which a processing liquid is supplied on an upper surface of the substrate rotated in step (c). The substrate support portion includes an inner portion that vertically overlaps the substrate held by the substrate holding portion in step (a), and an upper end of the substrate support portion is on a side below an upper surface of an overlapping portion of the substrate held by the substrate holding portion that overlaps the inner portion in the vertical direction.

These and other features and aspects of the disclosure will become more apparent from the following detailed description of the disclosure when taken in conjunction with the accompanying drawings.

DESCRIPTION OF THE EMBODIMENTS

Figure 1:
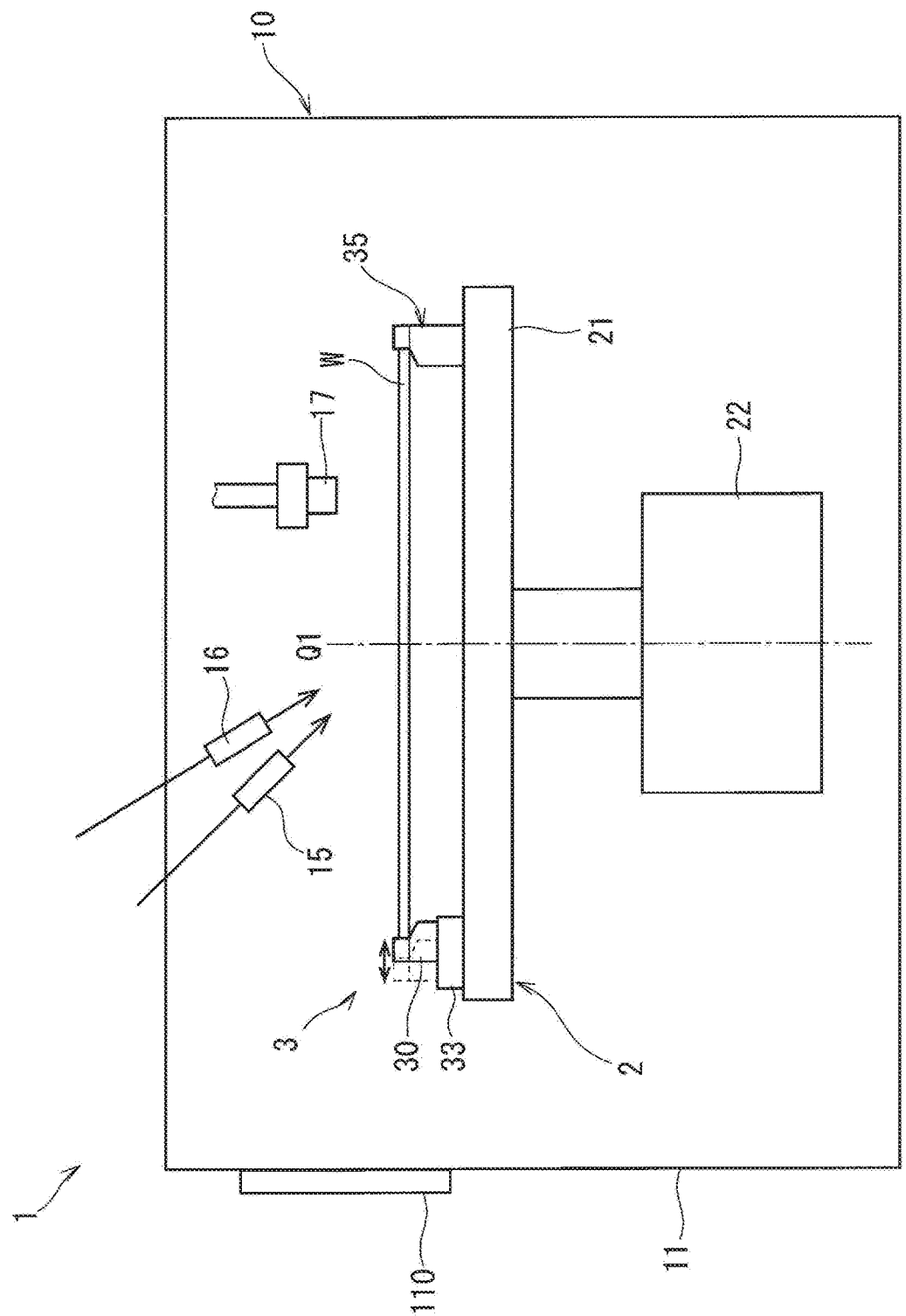
FIG. 1 is a schematic side view illustrating a substrate processing apparatus 1 of a first embodiment.

Hereinafter, embodiments of the disclosure will be described with reference to the accompanying drawings. Constituent elements described in these embodiments are merely examples, and the scope of the disclosure is not limited only to them. In the drawings, for ease of understanding, there may be cases in which dimensions and the number of respective portions are illustrated in an exaggerated or simplified manner as necessary.

As used throughout this disclosure, the singular forms "a," "an," and "the" include plural reference unless the context clearly dictates otherwise. Thus, for example, a reference to "a composition" includes a plurality of such compositions, as well as a single composition.

1. First Embodiment

Figure 2:
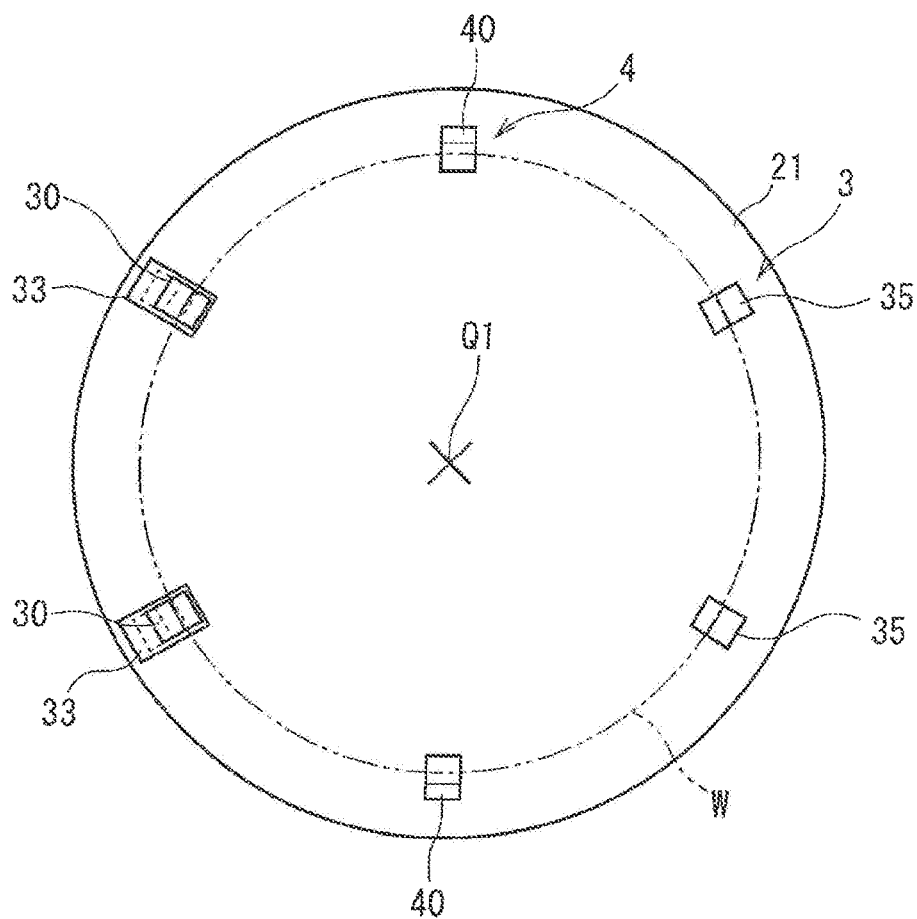
FIG. 2 is a schematic plan view illustrating an upper surface of a spin base 21 of the first embodiment.

FIG. 1 is a schematic side view illustrating a substrate processing apparatus 1 of a first embodiment. FIG. 2 is a schematic plan view illustrating an upper surface of a spin base 21 of the first embodiment. The substrate processing apparatus 1 includes a processing chamber 10 surrounded by a chamber wall 11. The processing chamber 10 includes a spin chuck 2 that holds a substrate to be rotatable. On a side surface of the chamber wall 11, a shutter unit 110 capable of opening and closing an opening is provided. A transfer mechanism (not illustrated) accesses the inside of the chamber wall 11 via the opening of the shutter unit 110.

The substrate processing apparatus 1 includes a processing liquid nozzle 15 and a gas nozzle 16.

The processing liquid nozzle 15 discharges a processing liquid supplied from a processing liquid source (not illustrated) through a pipe. The processing liquid discharged from the processing liquid nozzle 15 is a chemical liquid or a rinsing liquid. The chemical liquid may be, for example, sulfuric acid, acetic acid, nitric acid, hydrochloric acid, hydrofluoric acid, buffered hydrofluoric acid (BHF), ammonia water, hydrogen peroxide water, an organic acid (for example, citric acid, oxalic acid, or the like), an organic alkali, or the like. Further, the rinsing liquid is deionized water (DIW) or the like.

The gas nozzle 16 discharges a processing gas supplied from a gas supply source (not illustrated) through a pipe. As the gas, nitrogen gas or the like is used. The processing liquid nozzle 15 and the gas nozzle 16 are connected to a nozzle moving mechanism (not illustrated). The nozzle moving mechanism moves each of the processing liquid nozzle 15 and the gas nozzle 16 between a supply position and a retreat position. The supply position is a position at which the processing liquid or the processing gas (hereinafter, these will be referred to as a "processing fluid") can be discharged toward an upper surface of a substrate W held by a spin chuck 2. Also, the retreat position is at a position farther from the substrate W than the supply position, and is, for example, at a position away from the upper side of the spin base 21 to the outside.

The substrate processing apparatus 1 includes a brush 17. The brush 17 may be, for example, one formed in a porous sponge form of for example polyvinyl alcohol (PVA), one including a large number of bristles made of polypropylene (PP), or one configured using a combination of these.

The brush 17 physically cleans the upper surface of the substrate W by a lower end portion thereof being brought into contact with the upper surface of the substrate W held by the spin chuck 2.

Further, the substrate processing apparatus 1 may include a rotary motor that rotates the brush 17 around a rotation axis in a vertical direction. By bringing the brush 17 into contact with the substrate W while rotating the brush 17, a surface of the substrate W can be efficiently cleaned.

The spin chuck 2 includes the spin base 21 formed in a disc shape, a spin motor (rotation drive unit) 22 for rotating the spin base 21 around a rotation axis Q1 in the vertical direction, a substrate holding portion 3, and a substrate support portion 4. The spin motor 22 is disposed below the spin base 21. The substrate holding portion 3 and the substrate support portion 4 are provided on an upper surface of the spin base 21.

The substrate holding portion 3 includes two movable holding pins 30 movable with respect to the spin base 21 and two fixed holding pins 35 fixed to the spin base 21. Also, the substrate support portion 4 includes two support pins 40.

The two movable holding pins 30, the two fixed holding pins 35, and the two support pins 40 are disposed on the spin base 21 at regular intervals around the rotation axis Q1. Specifically, the respective pins are disposed at an angular interval of 60° around the rotation axis Q1. However, an angular interval is not limited to thereto. The respective pins may be disposed at an angular interval of less than 180°.

In the present example, two movable holding pins 30 are disposed adjacent to each other, and the two fixed holding pins 35 are also disposed adjacent to each other. The two movable holding pins 30 and the two fixed holding pins 35 are disposed to face each other on opposite sides of the rotation axis Q1. Also, the two support pins 40 are disposed to face each other on opposite sides of the rotation axis Q1. Also, among the two support pins 40, one is disposed between one movable holding pin 30 and one fixed holding pin 35, and the other is disposed between the other movable holding pin 30 and the other fixed holding pin 35.

<Substrate Holding Portion 3>

The substrate holding portion 3 of the present embodiment has a total of four holding pins (two movable holding pins 30 and two fixed holding pins 35), and holds a peripheral end portion of the substrate W at four positions. However, a total number of holding pins is not limited thereto. It is preferable that the substrate holding portion 3 include one or more movable holding pins 30 and one or more fixed holding pins 35, or two or more movable holding pins 30. When the number of holding pins is five or more, there is a likelihood that some of the holding pins will not contribute to the holding of the substrate W. In this case, since a gap is formed between some of the holding pins which do not contribute to the holding and the peripheral end portion of the substrate W, a processing liquid may pass around to a lower surface side of the substrate W through the gap and the lower surface may be contaminated. From this viewpoint, the number of holding pins is preferably four or less.

<Movable Holding Pin 30>

Figure 3:
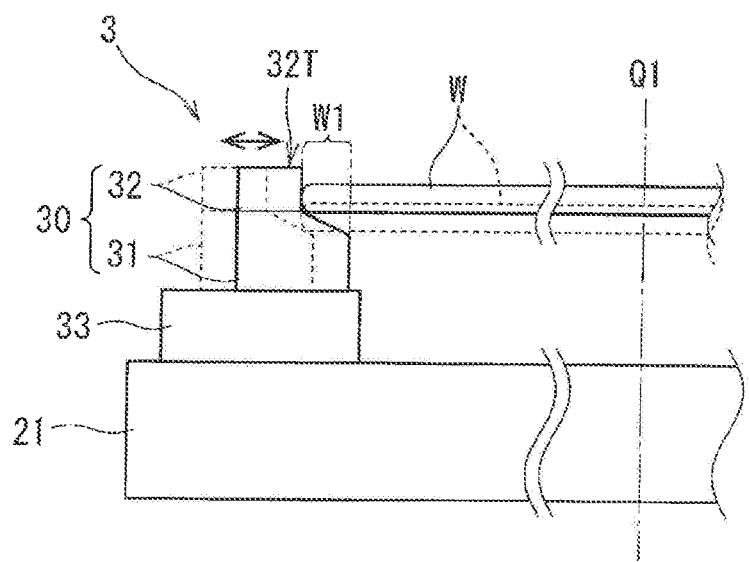
FIG. 3 is a schematic side view illustrating a movable holding pin 30 of the first embodiment.

FIG. 3 is a schematic side view illustrating the movable holding pin 30 of the first embodiment. In FIG. 3, the movable holding pin 30 in a state in which it holds the substrate W is illustrated by a solid line, and the movable holding pin 30 in a state in which the holding of the substrate W is released is illustrated by a broken line.

The movable holding pin 30 includes a base portion 31 and a contact portion 32 (first contact portion). A lower portion of the base portion 31 is attached to a moving unit 33 to be described below, and the contact portion 32 is provided on an upper portion of the base portion 31. The contact portion 32 has a contact surface 32S that is brought into contact with the peripheral end portion of the substrate W. The contact surface 32S is parallel to the vertical direction.

The movable holding pin 30 is connected to a moving unit 33 provided on a front surface of the spin base 21. The moving unit 33 moves the movable holding pin 30 in a direction approaching to and separating from (approach-separation direction) the rotation axis Q1.

The moving unit 33 is connected to the lower portion of the base portion 31, and moves the contact portion 32 together with the base portion 31 in the approach-separation direction. Here, the moving unit 33 linearly moves the movable holding pin 30 in a radial direction of the spin base 21. Therefore, the movable holding pin 30 moves in the approach-separation direction with the contact surface 32S of the contact portion 32 facing the rotation axis Q1. The moving unit 33 is controlled by a control unit 5.

Further, the moving unit 33 may be configured to rotate the movable holding pin 30 around a predetermined rotation axis in the vertical direction. When the movable holding pin 30 rotates and approaches the rotation axis Q1, the contact surface 32S is directed toward the rotation axis Q1.

As illustrated in FIG. 3, in a state in which the movable holding pin 30 holds the substrate W, an upper end of the movable holding pin 30 (here, an upper end 32T of the contact portion 32) is disposed above the upper surface of the substrate W. More specifically, the upper end 32T is positioned higher than an upper surface of an overlapping portion W1 of the substrate W held by the substrate holding portion 3 that overlaps the movable holding pin 30 (here, the base portion 31) in the vertical direction. In this way, since the upper end 32T is positioned higher than the upper surface of the substrate W, the substrate W is positioned and held not to move outward beyond the movable holding pin 30.

<Fixed Holding Pin 35>

Figure 4:
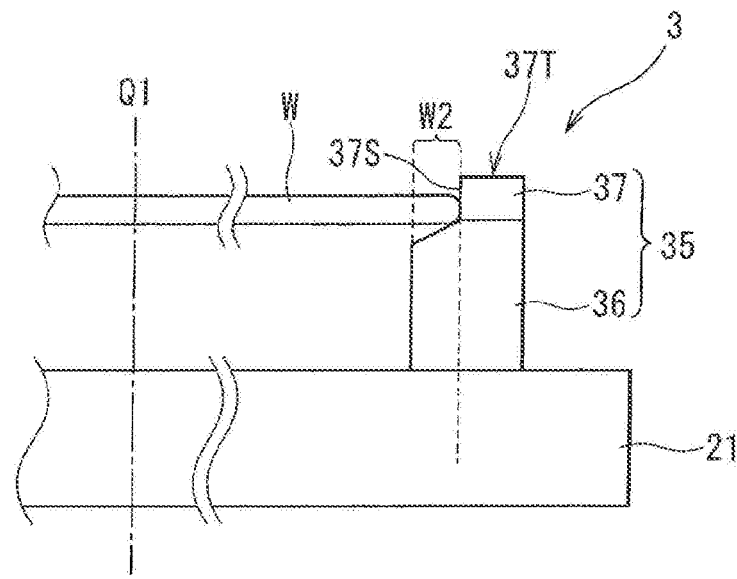
FIG. 4 is a schematic side view illustrating a fixed holding pin 35 of the first embodiment.

FIG. 4 is a schematic side view illustrating the fixed holding pin 35 of the first embodiment. The fixed holding pin 35 includes a base portion 36 and a contact portion 37 (second contact portion). The base portion 36 is fixed to the upper surface of the spin base 21, and the contact portion 37 is provided on an upper portion of the base portion 36. The contact portion 37 has a contact surface 37S that is brought into contact with the peripheral end portion of the substrate W. The contact surface 37S is parallel to the vertical direction.

As illustrated in FIG. 4, in a state in which the fixed holding pin 35 holds the substrate W, an upper end of the fixed holding pin 35 (specifically, an upper end 37T of the contact portion 37) is disposed above the upper surface of the substrate W. More specifically, the upper end 37T is positioned higher than an upper surface of an overlapping portion W2 of the substrate W held by the substrate holding portion 3 that overlaps the fixed holding pin 35 in the vertical direction (here, overlaps the base portion 36 in the vertical direction). In this way, since the upper end 37T is positioned higher than the upper surface of the substrate W, the substrate W is positioned and held not to move outward beyond the fixed holding pin 35.

In the present example, the substrate holding portion 3 sandwiches the peripheral end portion of the substrate W using a plurality of holding pins. However, the substrate holding portion 3 may be configured to hold the substrate W in a horizontal posture by suctioning and holding the substrate W.

<Substrate Support Portion 4>

Figure 5:
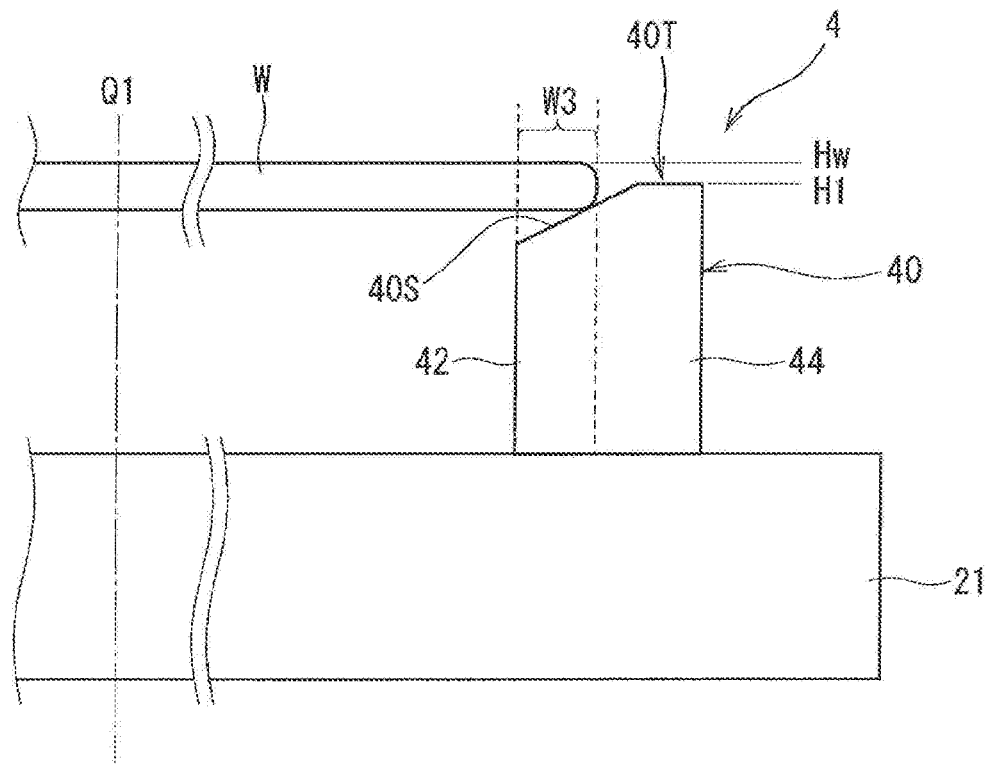
FIG. 5 is a schematic side view illustrating a support pin 40 of the first embodiment.
Figure 6:
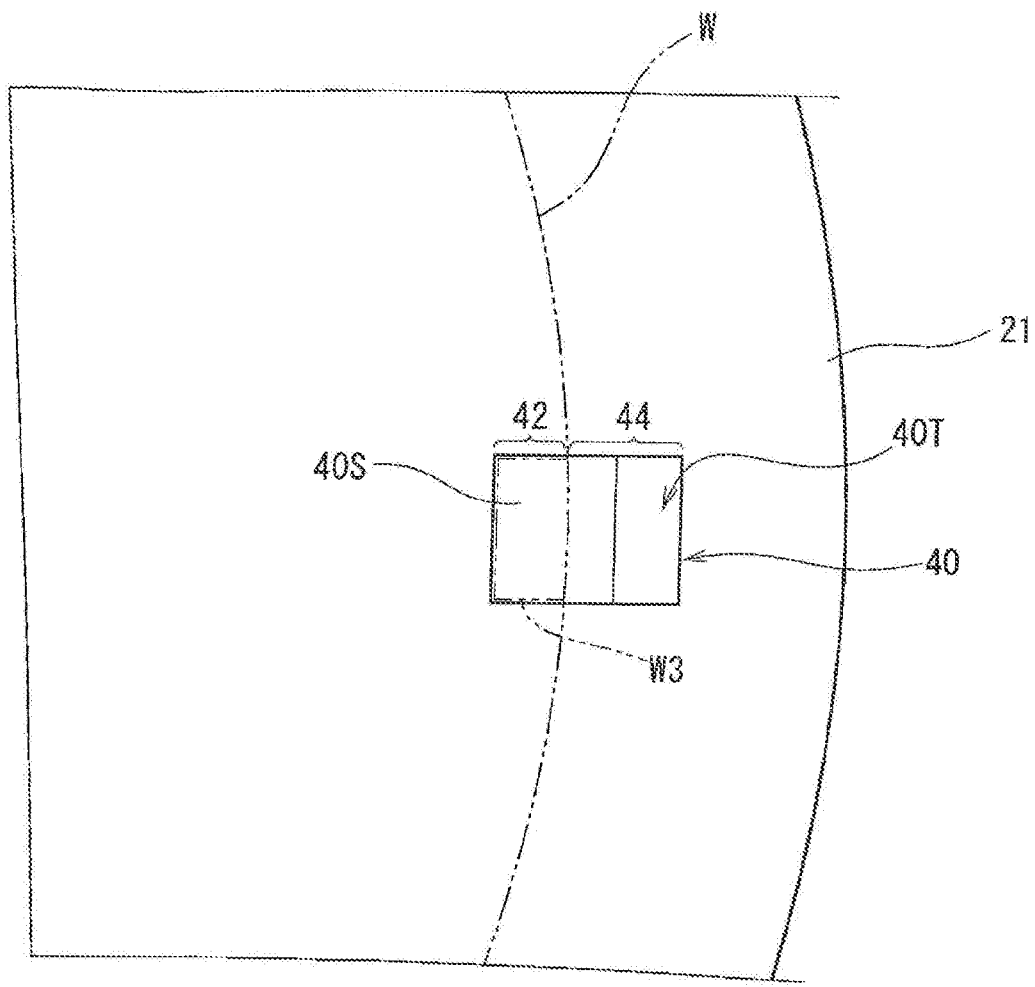
FIG. 6 is a schematic plan view illustrating the support pin 40 of the first embodiment.

FIG. 5 is a schematic side view illustrating the support pin 40 of the first embodiment. In FIG. 5, the substrate W supported by the substrate holding portion 3 is illustrated by a solid line. FIG. 6 is a schematic plan view illustrating the support pin 40 of the first embodiment.

The substrate support portion 4 includes two support pins 40. Each of the support pins 40 has an inclined surface 40S inclined toward an upper side in the vertical direction and in a direction away from the rotation axis Q1 (on a radial outer side of the spin base 21) at an upper portion thereof.

In the present example, as illustrated in FIG. 5, the inclined surface 40S is a smooth surface inclined at a constant inclination. However, the inclined surface 40S may be a smooth surface whose inclination changes in a direction away from the rotation axis Q1. Further, it is not indispensable that the inclined surface 40S is a smooth surface. For example, a height of the inclined surface 40S from the spin base 21 may change in a staircase shape in a direction away from the rotation axis Q1.

As illustrated in FIG. 5, the support pin 40 has an inner portion 42 vertically overlapping the substrate W held by the substrate holding portion 3 (that is, overlapping the substrate W in a plan view), and an outer portion 44 protruding outward with respect to the peripheral end portion of the substrate W in a plan view. Then, a height position H1 of an upper end of the substrate support portion 4 (that is, an upper end 40T of the support pin 40) is on a side below a height position Hw of the upper surface of the substrate W. More specifically, the upper end 40T is at a position below an upper surface of an overlapping portion W3 of the substrate W held by the substrate holding portion 3 that overlaps the inner portion 42 of the support pin 40 in the vertical direction.

When a processing liquid is supplied to the rotating substrate W, the processing liquid is shaken off from the upper surface of the substrate W. In the present embodiment, since the upper end 40T is at a position below the upper surface of the substrate W, impinging of the processing liquid shaken off outward against the support pin 40 can be inhibited. As a result, since an amount of the processing liquid passing around to the lower surface side of the substrate W is effectively reduced, contamination of the lower surface is reduced.

Also, when the support pin 40 is provided, the total number of movable holding pins 30 and fixed holding pins 35 can be reduced, and the substrate W can be appropriately held above the spin base 21. In this way, contamination of the lower surface of the substrate W can be reduced by reducing the number of movable holding pins 30 and fixed holding pins 35.

<Control Unit 5>

The control unit 5 controls each drive unit or the like (for example, the spin motor 22, the moving unit 33, or the like) of the substrate processing apparatus 1. A hardware configuration of the control unit 5 is similar to that of a general computer. That is, the control unit 5 includes a central processing unit (CPU) which performs various types of arithmetic processing, a read-only memory (ROM) which is a read-only memory storing basic programs, a random-access memory (RAM) which is a readable/writable memory storing various types of information, and a storage unit which stores control applications, data, and the like.

<Operation of Substrate Processing Apparatus 1>

Figure 7:
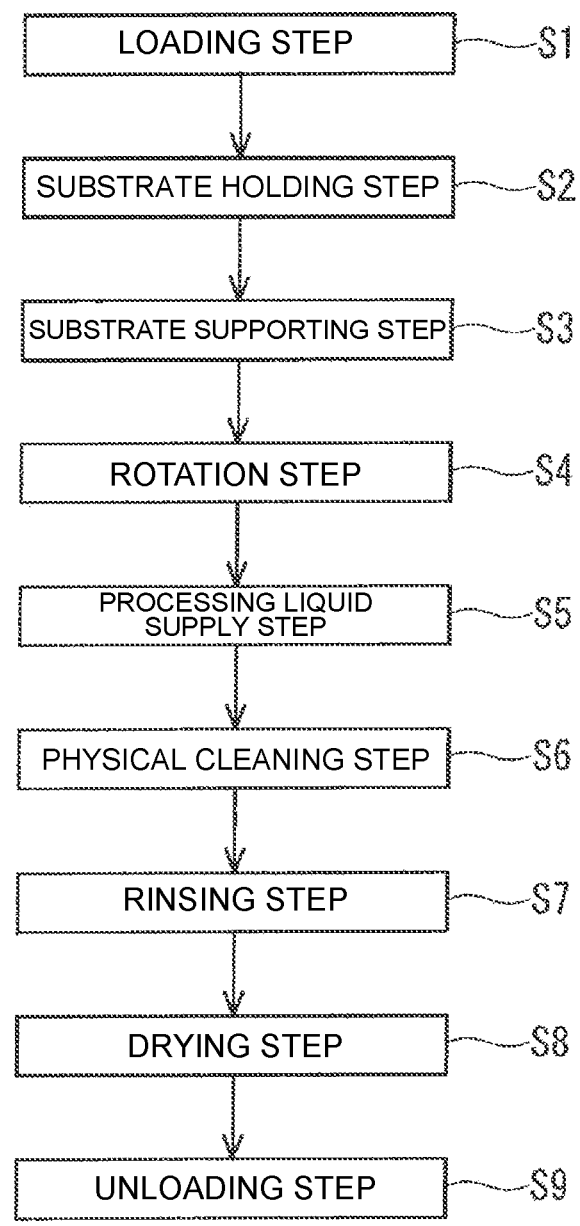
FIG. 7 is a flowchart showing an operation of the substrate processing apparatus 1 of the first embodiment.

FIG. 7 is a flowchart showing an operation of the substrate processing apparatus 1 of the first embodiment. It is assumed that each operation of the substrate processing apparatus 1 to be described below is performed under the control of the control unit 5.

First, the substrate processing apparatus 1 performs a loading step S1. The loading step S1 is a step in which a transfer mechanism (not illustrated) loads the substrate W to be processed into the processing chamber 10 of the substrate processing apparatus 1. In the loading step S1, the substrate W is placed on the two movable holding pins 30 and the two fixed holding pin 35 of the substrate holding portion 3. Specifically, the substrate W is placed on the base portions 31 of the movable holding pins 30 and the base portions 36 of the fixed holding pins 35.

After the loading step S1, the substrate processing apparatus 1 performs the substrate holding step S2. The substrate holding step S2 is a step in which the substrate holding portion 3 holds the substrate W. Specifically, the two moving units 33 respectively bring the two movable holding pins 30 closer to the rotation axis Q1 so that the contact portions 32 of the movable holding pins 30 are respectively brought into contact with the peripheral end portion of the substrate W. Further, the moving units 33 respectively move the movable holding pins 30 inward so that each of the contact portions 32 moves the substrate W to the other side (see FIG. 3). Thereby, each of the contact portions 37 of the two fixed holding pins 35 comes in contact with the peripheral end portion of the substrate W (see FIG. 4). In this way, the substrate W is sandwiched between the two movable holding pins 30 and the two fixed holding pins 35 at four different places of the peripheral end portion.

Also, the substrate processing apparatus 1 performs a substrate supporting step S3. The substrate supporting step S3 is performed in parallel with the substrate holding step S2. The substrate supporting step S3 is a step in which the two support pins 40 support the substrate W from below when the substrate W is held by the substrate holding portion 3 in the substrate holding step S2 (see FIG. 5).

After the substrate supporting step S3, the substrate processing apparatus 1 performs a rotation step S4. Specifically, the spin motor 22 rotates the spin base 21 to rotate the substrate W held by the substrate holding portion 3 around the rotation axis Q1.

After the rotation step S4, the substrate processing apparatus 1 performs a processing liquid supply step S5. Specifically, the processing liquid nozzle 15 is disposed above the substrate W held by the substrate holding portion 3, and discharges a processing liquid (for example, DIW) toward the substrate W rotating in the rotation step S4.

After the processing liquid supply step S5, the substrate processing apparatus 1 performs a physical cleaning step S6. The physical cleaning step S6 is a step in which the substrate W is physically cleaned. Specifically, the gas nozzle 16 is disposed at the supply position on the substrate W, and a processing gas (for example, nitrogen gas) is discharged toward the substrate W to which the processing liquid has been supplied in the processing liquid supply step S5. Due to a pressure of the processing gas, the substrate W is physically cleaned. Further, instead of discharging the processing gas from the gas nozzle 16, the substrate W may be physically cleaned with the brush 17.

In the processing liquid supply step S5, the processing liquid supplied to the substrate W moves toward an outer edge portion due to rotation of the substrate W and is shaken off to the outside of the substrate W. Also, particles generated in the physical cleaning step S6 are washed away by the processing liquid. Since the two support pins 40 of the substrate support portion 4 are on a side below the substrate W, impinging of the processing liquid containing particles against each of the support pins 40 is reduced. As a result, since an amount of the processing liquid passing around to the lower surface side of the substrate W is reduced, contamination of the lower surface of the substrate W is reduced.

After the physical cleaning step S6, the substrate processing apparatus 1 performs a rinsing step S7. In the rinsing step S7, the substrate processing apparatus 1 stops the discharge of nitrogen gas from the gas nozzle 16 and discharges a rinsing liquid (for example, DIW) from the processing liquid nozzle 15.

After the rinsing step S7, the substrate processing apparatus 1 performs a drying step S8. Specifically, the substrate processing apparatus 1 stops the discharge of the rinsing liquid from the processing liquid nozzle 15, and moves these nozzles to the retreat positions. Then, the spin motor 22 rotates the spin base 21 at a high speed (for example, 1000 rpm or more) to shake off the rinsing liquid on the substrate W to the outside. As a result, the substrate W is dried.

After the drying step S8, the substrate processing apparatus 1 performs an unloading step S9. The unloading step S9 is a step in which the substrate W held by the substrate holding portion 3 in the processing chamber 10 is unloaded to the outside of the processing chamber 10. Specifically, the moving unit 33 moves the movable holding pins 30 in a direction away from the rotation axis Q1. As a result, the holding of the substrate W by the substrate holding portion 3 is released. Then, the substrate processing apparatus 1 unloads the substrate W whose holding has been released from the substrate holding portion 3 to the outside of the processing chamber 10 using the transfer mechanism that has caused the substrate to enter the processing chamber.

2. Second Embodiment

Next, a second embodiment will be described. In the following description, elements having the same functions as the constituent elements of the substrate processing apparatus 1 already described will be denoted by the same reference signs or reference signs to which alphabetical letters are added, and detailed description thereof may be omitted.

Figure 8:
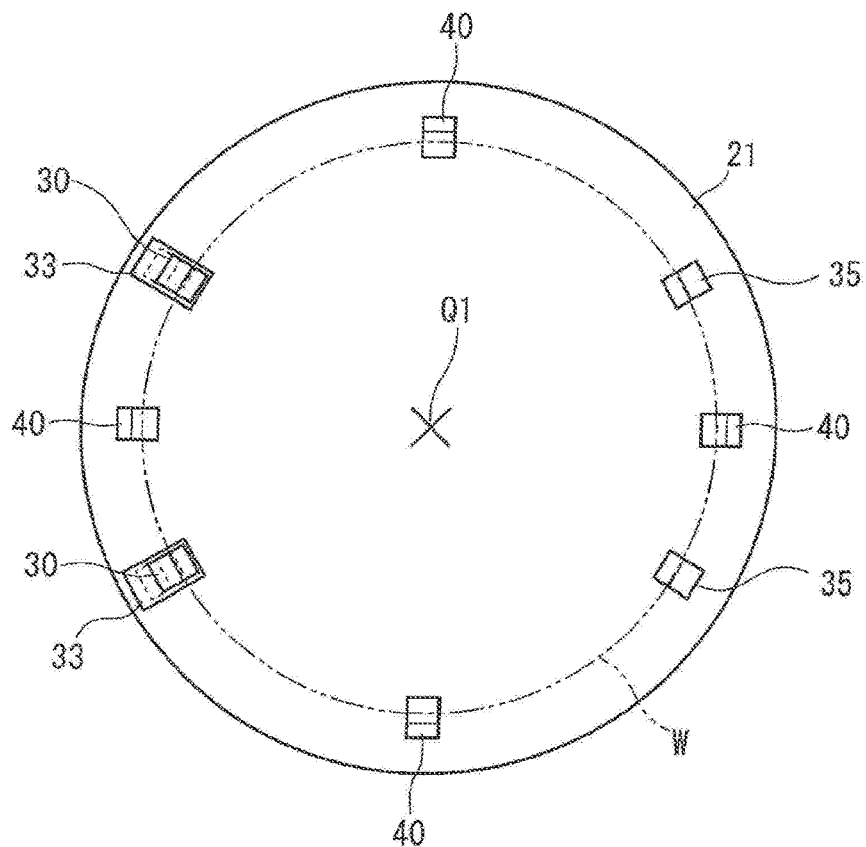
FIG. 8 is a schematic plan view illustrating an upper surface of a spin base 21 of a second embodiment.

FIG. 8 is a schematic plan view illustrating an upper surface of a spin base 21 of the second embodiment. In the first embodiment, the substrate support portion 4 is constituted by the two support pins 40, but in the present embodiment, two support pins 40 are further added. Specifically, one support pin 40 is additionally disposed between two movable holding pins 30 and 30 and the other support pin 40 is additionally provided between two fixed holding pins 35 and 35. In this way, the number of support pins 40 is not particularly limited, and can be arbitrarily set.

3. Third Embodiment

Figure 9:
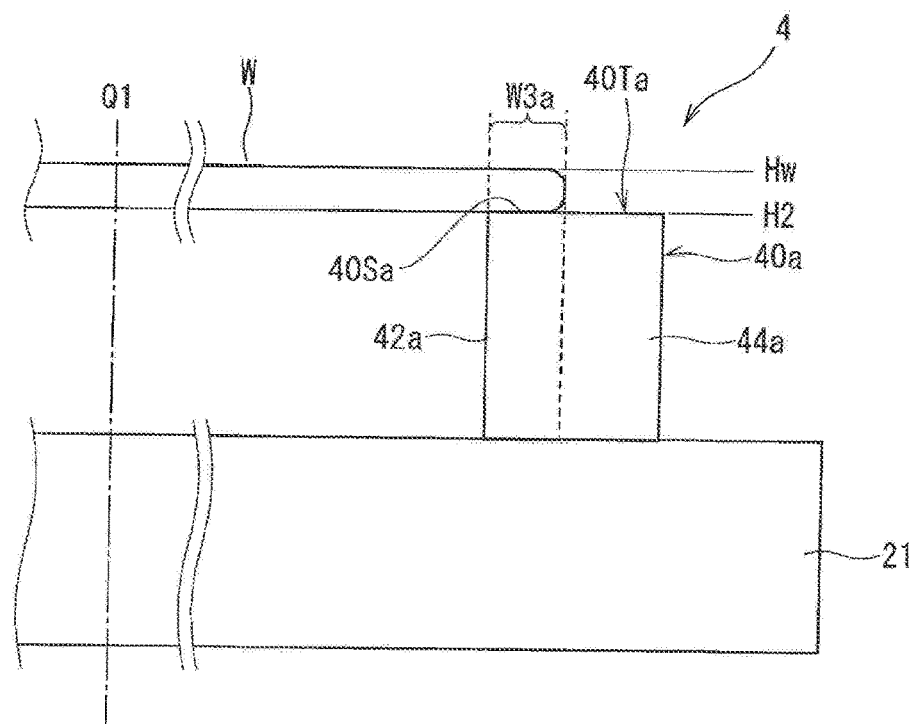
FIG. 9 is a schematic side view illustrating a support pin 40a of a third embodiment.

FIG. 9 is a schematic side view illustrating a support pin 40a of a third embodiment. The support pin 40 of the first embodiment has the inclined surface 40S at the upper portion, and supports the substrate W with the inclined surface 40S. On the other hand, the support pin 40a of the third embodiment does not have the inclined surface 40S, and an upper portion thereof has a flat surface 40Sa parallel to a horizontal plane. In a state in which a substrate holding portion 3 holds a substrate W, when a lower surface of the substrate W is brought into contact with the flat surface 40Sa, the substrate W is in a state in which it is supported by the support pin 40a.

A height position H2 of an upper end 40Ta (here, the flat surface 40Sa) of the support pin 40a is on a side below a height position Hw of an upper surface of the substrate W held by the substrate holding portion 3. Specifically, the upper end 40Ta of the support pin 40a is at a position below an upper surface of an overlapping portion W3a of the substrate W that overlaps the support pin 40a in a height direction. Therefore, since impinging of a processing liquid shaken off from the rotating substrate W against the support pin 40a is reduced, an amount of the processing liquid passing around to a lower surface side of the substrate W can be reduced.

Also in the present embodiment, the support pin 40a has an inner portion 42a vertically overlapping the substrate W held by the substrate holding portion 3 and an outer portion 44a protruding with respect to a peripheral edge portion of the substrate W in a plan view. In a case of the support pin 40a illustrated in FIG. 9, since an upper surface of the inner portion 42 (flat surface 40Sa) is in surface contact with the lower surface of the substrate W, there is a likelihood that contamination will be caused by a processing liquid passing around to the lower surface side of the substrate W. Accordingly, as illustrated in FIG. 5, when an upper portion of the inner portion 42 of the support pin 40 is made to be the inclined surface 40S, since a contact area between the substrate W and the support pin 40 is small, contamination can be effectively reduced.

4. Fourth Embodiment

Figure 10:
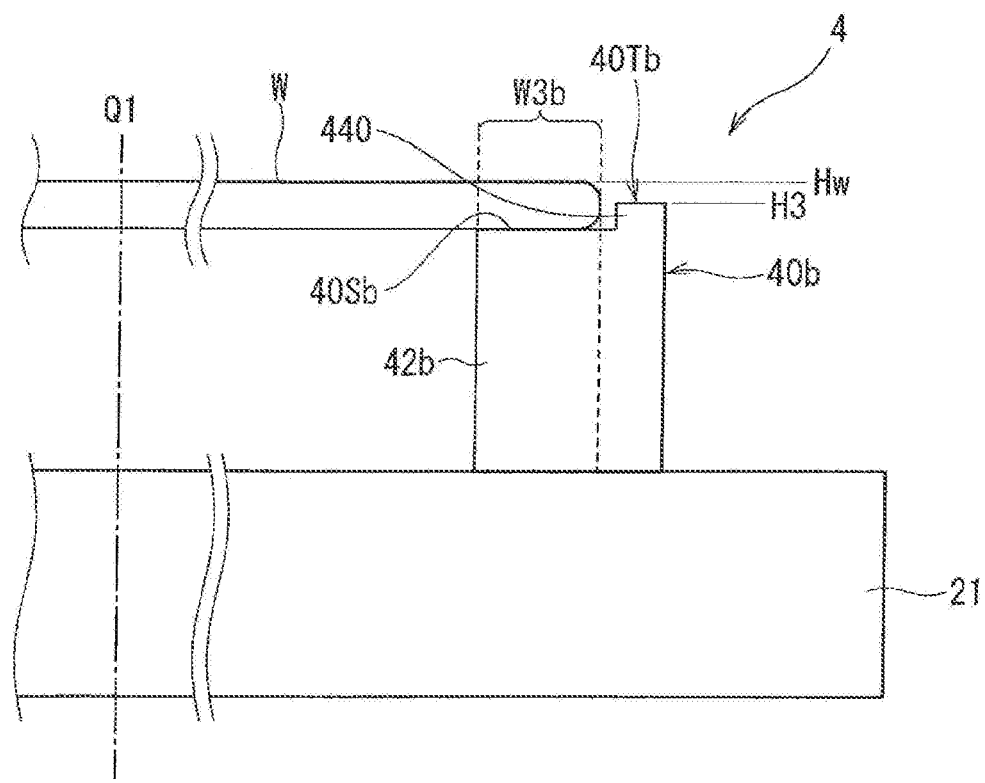
FIG. 10 is a schematic side view illustrating a support pin 40b of a fourth embodiment.

FIG. 10 is a schematic side view illustrating a support pin 40b of a fourth embodiment. The support pin 40 of the first embodiment has the inclined surface 40S at the upper portion, and supports the substrate W with the inclined surface 40S. On the other hand, an upper portion of the support pin 40b of the fourth embodiment has a step in which a height from the spin base 21 is increased by one step in a direction away from the rotation axis Q1. More specifically, the support pin 40b has a flat surface 40Sb parallel to a horizontal plane on a side close to the rotation axis Q1 at an upper portion thereof. Further, the support pin 40b has a protruding portion 440 protruding upward from the flat surface 40Sb on a side distant from the rotation axis Q1 at the upper portion.

In the present embodiment, the flat surface 40Sb is disposed at a height that can support a peripheral end portion of the substrate W held by a substrate holding portion 3 from below. Also, the protruding portion 440 is disposed on an outer side of the substrate W held by the substrate holding portion 3. That is, an inward surface of the protruding portion 440 facing the rotation axis Q1 faces a peripheral end surface of the substrate W held by the substrate holding portion 3.

A height position H3 of an upper end of the support pin 40b (here, an upper end 40Tb of the protruding portion 440) is on a side below a height position Hw of an upper surface of the substrate W. More specifically, the upper end 40Tb is at a lower position than an upper surface of an overlapping portion W3b of the substrate W held by the substrate holding portion 3 that overlaps an inner portion 42b of the support pin 40b in the vertical direction.

In the present embodiment, since the upper end 40Tb is at a position below the upper surface of the substrate W, impinging of a processing liquid shaken off outward from the substrate W against the support pin 40 can be inhibited. As a result, since an amount of the processing liquid passing around to a lower surface side of the substrate W is effectively reduced, contamination of the lower surface can be effectively reduced.

5. Modified Example

In the embodiments described above, the support pins 40, 40a, and 40b serving as a support member are disposed to protrude to the outside with respect to the peripheral edge portion of the substrate W held by the substrate holding portion 3 in a plan view. However, the support member may not protrude with respect to the substrate W held by the substrate holding portion 3, and may be disposed on an inner side of the substrate W.

An embodiment of the disclosure is a substrate processing apparatus for processing a substrate including a spin base, a rotation drive unit rotating the spin base around a rotation axis in a vertical direction, a substrate holding portion provided on the spin base and configured to hold the substrate, a substrate support portion provided on the spin base, disposed below the substrate held by the substrate holding portion, and having an inner portion overlapping the substrate in the vertical direction, and a processing liquid supply portion supplying a processing liquid on an upper surface of the substrate held by the substrate holding portion, in which an upper end of the substrate support portion is on a side below an upper surface of an overlapping portion of the substrate held by the substrate holding portion that overlaps the inner portion in the vertical direction.

According to this embodiment, the support portion is on a side below the upper surface of the substrate. Therefore, impinging of the processing liquid moving toward an outer side of the substrate on the rotating substrate against the support portion can be reduced. As a result, since an amount of the processing liquid passing around to a lower surface side of the substrate is reduced, contamination of the lower surface of the substrate is effectively reduced.

Preferably, the substrate holding portion holds the substrate by coming into contact with a plurality of places of a peripheral end portion of the substrate.

According to this embodiment, the substrate can be positioned and held by bringing the substrate holding portion into contact with the plurality of places on the peripheral end portion of the substrate.

Preferably, the substrate holding portion includes a movable holding portion movable in an approach-separation direction of approaching to and separating from the rotation axis, and a fixed holding portion fixed to the spin base.

According to this embodiment, the substrate can be appropriately positioned by moving the movable holding portion in the approach-separation direction and bringing the substrate into contact with the fixed holding portion.

Preferably, the movable holding portion includes one or two movable holding members movable in the approach and separation direction and configured to come in contact with a peripheral edge portion of the substrate.

According to this embodiment, the substrate can be appropriately positioned by moving one or two movable holding members in the approach-separation direction and bringing the substrate into contact with the fixed holding portion. In addition, by limiting the number of movable holding members coming into contact with the peripheral edge portion of the substrate to one or two, a likelihood of the processing liquid passing around to the lower surface side of the substrate via the movable holding members can be reduced.

Preferably, the fixed holding portion includes one or two fixed holding members fixed on the spin base and configured to come in contact with the peripheral edge portion of the substrate.

According to this embodiment, the substrate can be appropriately positioned by moving one or two fixed holding members in the approach-separation direction and bringing the substrate into contact with the fixed holding portion. Further, by limiting the number of fixed holding members coming into contact with the peripheral edge portion of the substrate to one or two, a likelihood of the processing liquid passing around to the lower surface side of the substrate via the fixed holding members can be reduced.

Preferably, the substrate support portion includes an inclined surface inclined toward an upper side in the vertical direction and in a direction away from the rotation axis.

According to this embodiment, since the support portion has a tapered surface, a size of a surface of the support portion in contact with the lower surface of the substrate can be reduced. Therefore, when the processing liquid passes around to the lower surface side of the substrate via the support portion, contamination of the lower surface of the substrate can be reduced.

Preferably, the substrate support portion includes an outer portion protruding with respect to a peripheral end portion of the substrate.

According to this embodiment, since the support portion is disposed to straddle from inside to outside the peripheral end portion of the substrate, the peripheral end portion of the substrate can be supported by the support portion.

Preferably, a physical cleaning portion which physically cleans the upper surface of the substrate held by the substrate holding portion is further provided.

According to this embodiment, the upper surface of the substrate can be physically cleaned.

Preferably, the substrate support portion includes a plurality of support members provided on the spin base and configured to support different portions of the substrate.

According to this embodiment, the support members can support the substrate at a plurality of places.

An embodiment of the disclosure is a substrate processing method for processing a substrate including (a) a step in which a substrate holding portion provided on a spin base holds a substrate, (b) a step in which a substrate support portion provided on the spin base supports the substrate held by the substrate holding portion in step (a), (c) a step in which the substrate is rotated by rotating the spin base around a rotation axis in a vertical direction, and (d) a step in which a processing liquid is supplied on an upper surface of the substrate rotated in step (c). The substrate support portion includes an inner portion that vertically overlaps the substrate held by the substrate holding portion in step (a), and an upper end of the substrate support portion is on a side below an upper surface of an overlapping portion of the substrate held by the substrate holding portion that overlaps the inner portion in the vertical direction.

According to this embodiment, the support portion is on a side below the upper surface of the substrate. Therefore, impinging of the processing liquid moving toward an outer side of the substrate on the rotating substrate against the support portion can be reduced. As a result, since an amount of the processing liquid passing around to a lower surface side of the substrate is reduced, contamination of the lower surface of the substrate is effectively reduced.

Preferably, the substrate holding portion holds the substrate by coming into contact with a plurality of places of a peripheral end portion of the substrate.

According to this embodiment, the substrate can be positioned and held by bringing the substrate holding portion into contact with the plurality of places of the peripheral end portion of the substrate.

Preferably, the substrate holding portion includes a movable holding portion movable in an approach-separation direction of approaching to and separating from the rotation axis, and a fixed holding portion fixed on the spin base, and step (a) includes a step in which the substrate is held by the movable holding portion and the fixed holding portion by moving the movable holding portion in the approach-separation direction.

According to this embodiment, the substrate can be appropriately positioned by moving the movable holding portion in the approach-separation direction and bringing the substrate into contact with the fixed holding portion.

Preferably, the movable holding portion includes a plurality of movable holding members movable in the approach-separation direction and having respective first contact portions configured to come in contact with different portions on the peripheral edge portion of the substrate, and step (a) includes a step in which the substrate is held by the plurality of movable holding members and the fixed holding portion by moving the plurality of movable holding members in the approach-separation direction.

According to this embodiment, the substrate can be appropriately positioned by moving the plurality of movable holding members in the approach-separation direction and bringing the substrate into contact with the fixed holding portion.

Preferably, the fixed holding portion includes a plurality of fixed holding members fixed on the spin base and having respective second contact portions configured to come in contact with different portions of the peripheral edge portion of the substrate, and step (a) includes a step in which the substrate is held by the movable holding portion and the plurality of fixed holding members.

According to this embodiment, the substrate can be appropriately positioned by moving the movable holding members in the approach-separation direction and bringing the substrate into contact with the plurality of fixed holding members which are fixed.

Preferably, the substrate support portion includes an inclined surface inclined toward an upper side in the vertical direction and in a direction away from the rotation axis.

According to this embodiment, since the support portion has a tapered surface, a size of a surface of the support portion in contact with the lower surface of the substrate can be reduced. Therefore, when the processing liquid passes around to the lower surface side of the substrate via the support portion, contamination of the lower surface of the substrate can be reduced.

Preferably, the substrate support portion includes an outer portion protruding with respect to the peripheral end portion of the substrate.

According to this embodiment, since the support portion is disposed to straddle from inside to outside the peripheral end portion of the substrate, the peripheral end portion of the substrate can be supported by the support portion.

Preferably, the substrate processing method further includes (e) a step in which a surface of the substrate to which the processing liquid is supplied in step (d) is physically cleaned.

According to this embodiment, an amount of processing liquid containing particles generated by physical cleaning passing around to the lower surface of the substrate via the support portion can be reduced. Therefore, the number of particles adhering to the lower surface of the substrate can be effectively reduced.

Preferably, the substrate support portion includes a plurality of support members provided on the spin base and configured to support different portions of the substrate, and step (b) includes a step in which the substrate held by the substrate holding portion in step (a) is supported by the plurality of support members.

According to this embodiment, the support members can support the substrate at a plurality of places.

While the disclosure has been shown and described in detail, the foregoing description is in all aspects illustrative and not restrictive. It is therefore understood that numerous modifications and variations can be devised without departing from the scope of the disclosure.

What is claimed is:

1. A substrate processing apparatus for processing a substrate, comprising:
   a spin base;
   a spin motor rotating the spin base around a rotation axis in a vertical direction;
   a holding pin provided on the spin base, configured to hold the substrate, having an inner portion disposed below the substrate and overlapping the substrate in the vertical direction, and having an outer portion non-overlapping the substrate in the vertical direction;
   a support pin provided on the spin base, having an inner portion disposed below the substrate and overlapping the substrate in the vertical direction, and having an outer portion non-overlapping the substrate in the vertical direction; and
   a processing liquid nozzle supplying a processing liquid on an upper surface of the substrate held by the holding pin, wherein
   an upper end of the outer portion of the support pin is an uppermost end of the support pin, and is below the upper surface of the substrate in a state where the substrate is held by the inner portion of the support pin, and
   the support pin is provided apart from the holding pin and is arranged to be non-overlapping with the holding pin in a plan view which is orthogonal to the vertical direction.

2. The substrate processing apparatus according to claim 1, wherein the holding pin holds the substrate by coming into contact with a plurality of places of a peripheral end portion of the substrate.

3. The substrate processing apparatus according to claim 1, wherein
   the holding pin comprises:
   a movable holding portion movable in an approach-separation direction of approaching to and separating from the rotation axis; and
   a fixed holding portion fixed to the spin base.

4. The substrate processing apparatus according to claim 3, wherein the movable holding portion comprises one or two movable holding members movable in the approach-separation direction and configured to come in contact with a peripheral edge portion of the substrate.

5. The substrate processing apparatus according to claim 3, wherein the fixed holding portion comprises one or two fixed holding members fixed on the spin base and configured to come in contact with the peripheral edge portion of the substrate.

6. The substrate processing apparatus according to claim 1, wherein the support pin comprises an inclined surface inclined toward an upper side in the vertical direction and in a direction away from the rotation axis.

7. The substrate processing apparatus according to claim 1, wherein the outer portion of the support pin is protruded with respect to a peripheral end portion of the substrate.

8. The substrate processing apparatus according to claim 1, further comprising:
   a physical cleaning portion which physically cleans the upper surface of the substrate held by the holding pin.

9. The substrate processing apparatus according to claim 1, wherein the support pin comprises a plurality of support members provided on the spin base and configured to support different portions of the substrate.

10. The substrate processing apparatus according to claim 1, wherein an upper end of the outer portion of the holding pin is an uppermost end of the holding pin, and is above the upper surface of the substrate in a state where the substrate is held by the inner portion of the holding pin.

* * * * *